United States Patent [19]

Lynch et al.

[11] Patent Number: 4,656,730
[45] Date of Patent: Apr. 14, 1987

[54] METHOD FOR FABRICATING CMOS DEVICES

[75] Inventors: William T. Lynch, Summit; Louis C. Parrillo, Warren, both of N.J.

[73] Assignee: American Telephone and Telegraph Company, AT&T Bell Laboratories, Murray Hill, N.J.

[21] Appl. No.: 674,274

[22] Filed: Nov. 23, 1984

[51] Int. Cl.⁴ .................. H01L 21/38; H01L 21/461
[52] U.S. Cl. .................. 29/571; 29/576 W; 29/577 C; 148/187
[58] Field of Search .............. 29/571, 577 C, 576 W; 148/188, 187

[56] References Cited

U.S. PATENT DOCUMENTS

| | | | |
|---|---|---|---|
| 4,435,896 | 3/1984 | Parillo et al. | 148/187 X |
| 4,459,741 | 7/1984 | Schwabe et al. | 29/577 C X |
| 4,477,310 | 10/1984 | Park et al. | 29/576 W |
| 4,493,740 | 1/1985 | Komeda | 148/188 X |
| 4,532,696 | 8/1985 | Iwai | 29/576 W |
| 4,534,824 | 8/1985 | Chen | 29/576 W |
| 4,536,945 | 8/1985 | Gray et al. | 29/577 C |

FOREIGN PATENT DOCUMENTS 148466 11/1980 Japan .
40563 3/1984 Japan .

OTHER PUBLICATIONS

"Directions in CMOS Technology," S. Kohyama et al., *IEEE International Electron Device Meeting, Technical Digest*, Dec. 6, 1983, pp. 151–155.

*Primary Examiner*—George T. Ozaki
*Attorney, Agent, or Firm*—Bernard Tiegerman

[57] ABSTRACT

A new method for fabricating CMOS devices, as well as the resulting devices, is disclosed. The method involves incorporating dopants into a semiconductor substrate through a region of the substrate surface, and diffusing the implanted dopants into the substrate to form a tub. Prior to the diffusion step, a trench is formed in, and extending beneath, the surface which partially or completely encircles the region. The trench serves to prevent the formation, or reduce the size, of a relatively low dopant concentration region, which would otherwise lead to undesirable leakage currents in the completed CMOS device, and prevents latchup.

11 Claims, 12 Drawing Figures

METHOD FOR FABRICATING CMOS DEVICES

BACKGROUND OF THE INVENTION

1. Field of the Invention

The invention pertains generally to semiconductor devices and, more particularly, to complementary metal oxide semiconductor devices.

2. Art Background

Complementary metal oxide semiconductor (CMOS) integrated circuit devices have come into increasing use because, among other advantageous properties, they consume relatively little power and exhibit relatively high noise immunity. CMOS devices include both n- and p-channel field effect transistors (FETs) in the same substrate. These FETs are fabricated either in a bulk region of the substrate or in a tub (or tubs) formed in the substrate—the tub and the bulk region having either significantly different effective majority carrier concentrations or different majority carrier types. One device configuration (the single-tub configuration) utilizes FETs produced both in one or more tubs having the same conductivity types and in a bulk region of opposite conductivity type. The active channel of each FET, irrespective of location, has a conductivity type opposite to that of the region in which it is fabricated. In a second device configuration (the twin-tub configuration), FETs are fabricated in two different kinds of tubs, the first kind having a conductivity type opposite to that of the second kind.

Irrespective of configuration, CMOS devices are fabricated using procedures which are generally similar. Typically, dopants are incorporated into one or more portions of a substrate surface either by dopant implantation or by diffusion from a solid or gaseous dopant source. The substrate is then heated to diffuse the incorporated dopants into the body of the substrate to form one or more tubs. During the heating process, the incorporated dopants necessarily diffuse in all directions, e.g., downwardly (in the depth direction) into the substrate and laterally (transversely to the depth direction). This diffusion process results in dopants diffusing laterally beyond the boundary of the dopant incorporated surface portion to produce an annular region encircling the core tub region. In the case of a single-tub device, the annular region constitutes a transition zone across which conductivity type changes from that of the core tub region to that of the surrounding substrate. The effective majority carrier concentration in any portion of this transition zone is lower than that of the core (in a portion having the same conductivity type as that of the core) or the substrate (in a portion having the same conductivity type as that of the substrate). In the case of a twin-tub device, the lateral diffusion of p- and n-type dopants (from their respective dopant incorporated surface portions) toward each other yields a region of commingled dopants. Because of dopant compensation, this interface region also constitutes a transition zone across which conductivity type changes from p-type to n-type, and in which the effective majority carrier concentrations are lower than those of the core tub regions.

During operation of conventionally fabricated CMOS devices, undesirable leakage currents are often produced through conductivity type inversion in regions of low majority carrier concentration, i.e., transition zones. This inversion is induced at conventional operating voltages (e.g., 0 volts or 5 volts) by fields emanating from conductors, e.g., a signal lead, crossing a transition zone. The inversion, in turn, produces conducting paths between regions of the same conductivity type that were previously isolated by the uninverted transition region, e.g., between the source/drain regions of an FET in one tub (or substrate) and the adjacent, opposite-conductivity-type tub (or surrounding substrate). To prevent such leakage currents, FET formation in transition zones is avoided, i.e., the source and drain regions of the n-channel and p-channel FETs of CMOS devices are spaced from a transition zone by at least 1 μm. Because transition zones are typically 4 μm or more in width, these FETs are thus separated from one another by at least 6 μm, resulting in a relatively low packing density.

Providing a relatively large separation, e.g., 10 μm, between the n-channel and the p-channel FETs of a CMOS device has also been viewed as necessary to prevent yet another undesirable conduction phenomenon known as latchup—a phenomenon which produces either a temporary malfunction of the CMOS device or, in some cases, permanent device damage. (Regarding latchup, and latchup-avoidance techniques, see, e.g., S. M. Sze, editor, VLSI Technology (McGraw Hill, 1983) Chapter 11).

Thus, those engaged in the development of CMOS devices have sought, thus far without success, methods for fabricating CMOS devices which avoid the formation of transition zones, and thus permit higher packing densities, without necessarily inducing unacceptable latchup.

SUMMARY OF THE INVENTION

The invention involves a method for fabricating a CMOS device which prevents the formation, or substantially reduces the size, of transition zones, and thus permits the spacing between the n-channel and p-channel FETs to be equal to or less than about 5 μm, and even as small as the resolution limit of the lithographic technique used to fabricate the device. The invention also involves the devices formed in accordance with the inventive fabrication method.

Transition zones are avoided, or their sizes are reduced, in accordance with the invention, by forming a trench which partially or completey encircles the (or one of the) surface portion(s) of a substrate into which dopants have been incorporated, prior to the diffusion step leading to the formation of one or more tubs. The trench serves to prevent, or reduce, lateral diffusion of incorpoated dopant into a region (or regions) where such diffusion is not desired.

The trench not only prevents the formation, or reduces the size, of transition zones, but it also prevents, or substantially reduces the possibility of, latchup. Because trenches having widths equal to or less than about 5 μm or even less than about 1 μm are readily fabricated, latchup-free and transition zonefree CMOS devices, having a spacing between the n-channel and p-channel FETs equal to or less than about 5 μm, are also readily fabricated.

BRIEF DESCRIPTION OF THE DRAWINGS

The invention is described with reference to the accompanying drawings, wherein.

DETAILED DESCRIPTION

Transition zones are avoided, or their sizes are significantly reduced, by forming a trench in the CMOS device substrate, partially or wholly encircling a dopant incorporated substrate region, prior to the diffusion step (leading to the formation of a tub or tubs), thus creating a barrier to lateral diffusion. The presence of the trench in the completed CMOS device also prevents, or significantly reduces the possibility of, latchup. Trenches employed in a different context, but having configurations useful for the present invention, are disclosed in copending, coassigned U.S. patent application Ser. No. 540,624 filed by W. T. Lynch and L. C. Parrillo on Oct. 11, 1983, which is hereby incorporated by reference.

Figure 5:
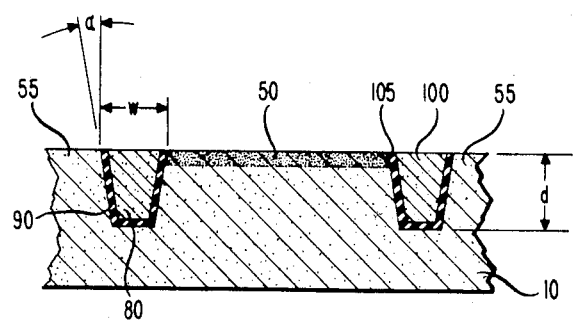

A trench 80, for preventing or reducing lateral dopant diffusion from a dopant incorporated region 50 of a substrate 10 to a region (or regions) 55 which such diffusion is not desired (and where a transition zone or zones would otherwise be formed), is illustrated, in cross-section, in FIG. 5. The trench 80, which is readily formed using, for example, conventional lithographic and etching techniques, is positioned between the regions 50 and 55, the length of the trench being sufficient to safeguard (i.e., prevent or reduce lateral dopant diffusion to) the region 55. For example, if the region 55 encircles the region 50 and all of the region 55 is to be safeguarded, then (as shown in FIG. 5) the trench also encircles the region 50. The trench either straddles the periphery of the region 50, or is entirely external to the region 50, or a portion of the trench is external to the region 50 and a portion straddles a segment of the periphery of the region 50.

The trench 80 has a width, w, which (for purposes of the invention) is the average spacing between two curves defined by the intersection of two surfaces approximating the two opposing sidewalls of the trench and a reference plane. Specifically, the width is measured by: (1) forming a least-squares-fit planar approximation to the surface 20, as it exists prior to the fabrication of the trench 80; (2) taking cross-sectional views of the trench by cutting the trench (over its entire length) with parallel planes which are perpendicular to the plane defined in (1), which intersect both sidewalls of the trench, and are infinitesimally spaced from one another; (3) forming linear least-squares-fit approximations to the trench sidewalls, as viewed in each of the above cross-sectional views, the resulting two sets of lines defining two surfaces approximating the two trench sidewalls; (4) choosing two regions of the surface 20, on opposite sides of the trench 80, which do not encompass processing-produced topography, which are spaced from the trench by about 1 $\mu$m, and have lengths approximately equal to that of the trench and widths of about 10 $\mu$m; (5) defining a least-squares-fit planar approximation to each of the regions chosen in (4), and choosing as a reference plane the planar approximation closest to the bottom of the trench; (6) determining the two curves produced by the intersection of the reference plane with the two approximation surfaces defined in (3); and (7) drawing the shortest line from each point of one of the two curves to the opposite curve, the width of the trench being the average length of these lines.

Preferably, the width w is less than or equal to about 5 $\mu$m, and even as small as the resolution or alignment limit of the lithographic technique used in etching the trench. (Current commercial photolithographic techniques, for example, have a resolution limit of about 1 $\mu$m and an alignment limit of about 0.25 $\mu$m.) Trenches having such widths result in transition zones which are significantly smaller than those produced during conventional device fabrication methods, thus permitting reductions in the spacing between the n-channel and p-channel FETs and corresponding increases in packing density. The highest packing densities are achieved by fabricating the FETs abutting (the source or drain of an FET abuts) the trench.

The trench 80 also has a depth, d, which is defined with reference to the centerline of the trench. This centerline is the locus of the midpoints of the lines defined in (7), above. The trench depth is determined by projecting perpendiculars from the reference plane defined in (5), above, extending through each point of the trench centerline, to the bottom of the trench. The average length of these perpendiculars is the depth of the trench. This depth is greater than or equal to the depth of the deepest (relative to the reference plane) source or drain region of the subsequently fabricated FETs. (At present, commercially available CMOS devices have source/drain depths of about 0.5 $\mu$m.) Shallower trenches are undesirable because they lead to the formation of transition zones adjacent to the source/drain regions, and thus lead to undesirable leakage currents. Preferably, the trench depth is greater than or equal to about 2 $\mu$m. Trench depths less than about 2 $\mu$m, while useful for preventing transition zones (provided the trench is deeper than the source/drain regions), are less than desirable because they do not significantly reduce the possibility of latchup, but are not precluded.

The acute angle $\alpha$ (see FIG. 5) between the trench sidewall 90 and a perpendicular drawn to the original surface 20 (the surface which existed prior to the formation of the trench 80) of the substrate 10, at the intersection of the sidewall and the surface 20, is generally not critical (with the exception discussed below). (For purposes of the invention, the angle $\alpha$ is defined as the average acute angle between the tangents drawn to each point of the sidewall 90 and the above perpendicular.) However, sidewall angles $\alpha$ larger than about 20 degrees are generally undesirable because, for typical device widths and depths, they lead to undesirably small directions in the sizes of transition zones. A trench having a sidewall angle $\alpha$ less than or equal to about 20 degrees is readily fabricated using reactive ion etching (RIE) techniques. Useful RIE etchant gases include, for example, a mixture of $Cl_2$ and Ar, $CCl_3F$ (Freon 11), and $SF_6$.

During the formation of a CMOS device, and subsequent to the fabrication of the trench 80, the substrate 10 is heated (using conventional techniques) to form the tub (or tubs) of the device, and conventional techniques are then used to fabricate the p- and n-channel FETs of the device. However, the presence of the trench presents a nonplanar surface which is inconvenient during the fabrication of the FETs. Thus, while not essential to the invention, the trench 80 is preferably filled with a filler material, prior to the formation of the FETs, to present an essentially planar surface. To avoid cracks which develop during, for example, the high temperature diffusion processes involved in fabricating the sources and drains of the FETs, the trench is preferably filled with a material 100 (see FIG. 5) whose coefficient of thermal expansion is not substantially different from that of the material of the substrate 10. That is, the ratio of the thermal expansion coefficient of the filler material to that of the substrate material is less than about 3. If the substrate material is, for example, of silicon, then useful filler materials which meet this requirement include polycrystalline silicon and amorphous silicon, which are readily deposited into the trench using conventional chemical vapor deposition (CVD) techniques. (Polycrystalline silicon is silicon having grain sizes larger than about 0.1 $\mu$m. Amorphous silicon, for purposes of the invention, is silicon which has grain sizes equal to or less than about 0.1 $\mu$m or is silicon which has neither grains nor a crystalline structure.) However, when using either polycrystalline silicon or amorphous silicon to fill the trench 80, and to avoid crack-inducing voids in the filler material, the sidewall angle $\alpha$ should be greater than or equal to about 5 degrees. (In this regard, and regarding etching techniques for meeting this requirement, see U.S. patent application Ser. No. 540,624.)

While not essential, the trench 80 preferably includes a relatively thin layer of dielectric material 105 (material whose bandgap is greater than about 2 eV) covering the interior surface of the trench, i.e., covering both the sidewall 90 (see FIG. 5) and the bottom of the trench. This dielectric material serves to prevent conduction of undesirable leakage and/or latchup-inducing currents, and diffusion of dopant, from the substrate 10 into the filler material 100. Useful dielectric materials include $SiO_2$ and $Si_3N_4$. If the substrate material is, for example, of silicon, then an $SiO_2$ layer 105 is formed on the interior surface of the trench by, for example, thermally oxidizing the silicon immediately adjacent the trench interior surface. On the other hand, an $Si_3N_4$ layer 105 is deposited onto the interior trench surface by conventional CVD techniques. The thickness of the dielectric layer (if employed) ranges from about 200 Angstroms to about 5000 Angstroms. A thickness less than about 200 Angstroms is undesirable because so thin a layer is ineffective to prevent short circuits through the filler material. A thickness greater than about 5000 Angstroms is undesirable because so thick a layer of, for example, thermally grown $SiO_2$ often results in the formation of cracks and dislocations at the $SiO_2$-Si interface during high temperature processing.

As a pedagogic aid to an even more complete understanding of the invention, the application of the inventive fabrication method to the formation of a single-tub CMOS device (see FIGS. 1-6) and a twin-tub CMOS device (see FIGS. 7-11) is described below. For purposes of illustration only, the substrate 10 (see FIG. 1) in which the single-tub CMOS device is formed is assumed to be of silicon and to have p-type conductivity. Typically, the doping level within the substrate 10 ranges from about $10^{13}$ cm$^{-3}$ to about $10^{17}$ cm$^{-3}$. Doping levels less than about $10^{13}$ cm$^{-3}$ are generally undesirable (but not precluded) because they often result in punch-through from the source to the drain of an FET formed in a substrate having so low a doping level. On the other hand, doping levels greater than about $10^{17}$ cm$^{-3}$ are generally undesirable (but not precluded) because they result in undesirably large source/drain-to-substrate capacitance, and substrates having such doping levels are difficult to compensate (change the conductivity type or the effective majority carrier concentration) during the tub(s) diffusion process.

The first step in the application of the inventive fabrication method to the formation of a single-tub CMOS device involves the incorporation of dopants into a region of the substrate 10. This is readily achieved using conventional implantation or diffusion techniques. In the former technique, the dopants are incorporated into a region of the substrate 10 by, for example, directing a beam of ionized dopants at the region. Alternatively, a masking layer is formed on the substrate surface which delineates the surface of the region (i.e., covers all of the substrate surface except the surface of the region), and the mask-covered substrate surface is then flood-exposed to a stream of ionized dopants. In the latter technique, the surface of the region is also delineated by a mask and the mask-covered substrate surface is exposed to a dopant-containing gas or solid.

Figure 1:
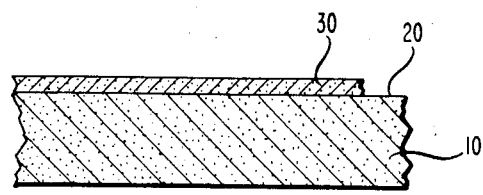
FIGS. 1-6 and 7-11 depict, respectively, the formation of a single-tub and twin-tub CMOS device using the inventive fabrication method.
Figure 2:
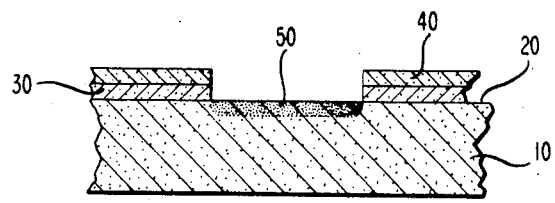

If the dopant incorporation procedure involves the use of a mask to delineate a region 50 (see FIG. 2) of the surface 20 of the substrate 10, then such a mask is formed, as shown in FIGS. 1-2, by, for example, initially thermally oxidizing the surface 20 to form a silicon dioxide layer 30. The thickness of the layer 30 ranges from about 0.05 $\mu$m to about 0.3 $\mu$m. Layers having thicknesses less than about 0.05 $\mu$m are undesirable because they often have undesirably many pinholes, while layers with thicknesses greater than 0.3 $\mu$m are generally unnecessarily thick. The layer 30 is then patterned, i.e., the portion of the layer 30 covering the region 50 is removed, by conventional lithographic and etching techniques. For example, a resist 40 is deposited onto the surface of the silicon dioxide layer 30, the resist is selectively exposed and then developed, and the layer 30 etched through the patterned resist. Useful etchants include, for example, solutions containing hydrofluoric acid. The patterned silicon dioxide layer 30, either alone or in combination with the patterned resist 40, constitutes the desired masking layer. (If dopants are to be implanted, then it is often unnecessary to etch the silicon dioxide layer 30. That is, in many instances the patterned resist 40 is thick enough (in relation to specific dopants and dopant energies) to prevent dopant penetration, and thus thick enough to act as an implantation mask, while the thickness of the layer 30 is often small enough (in relation to specific dopants and dopant energies) to permit ready dopant penetration.)

With the patterned silicon dioxide layer 30 (either alone or in combination with the patterned resist layer 40) screening the remainder of the surface 20, the region 50 is, for example, implanted with an n-type dopant such as phosphorus. The number of implanted dopants per unit area ranges, for present device designs, from about $3 \times 10^{11}$ cm$^{-2}$ to about $1 \times 10^{14}$ cm$^{-2}$. Implant levels less than about $3 \times 10^{11}$ cm$^{-2}$ are undesirable because they often result in punch-through from the sources and drains of FETs subsequently formed within the tubs in the substrate 10, to the substrate 10. On the other hand, implant levels greater than about $1 \times 10^{14}$ cm$^{-2}$ are undesirable because they result in undesirably large source/drain-to-substrate capacitance.

In contrast to previous fabrication methods, and to prevent the formation of a transition zone, a trench 80 (see FIG. 4) is formed in (and extends below) the surface 20, prior to the diffusion step, or even prior to the dopant incorporation, e.g., implantation, step. The trench encircles all, or a portion, of the region 50. Preferably, the trench straddles the boundary delineated by the masking layer 30.

Figure 3:
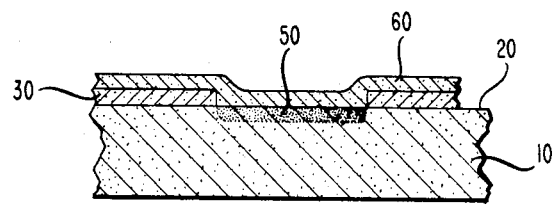
Figure 4:
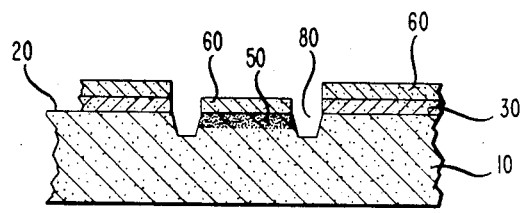

The trench 80 is readily formed (as depicted in FIGS. 3-4) using lithographic and etching techniques. That is, an etch mask 60 is initially formed which delineates the portion of the substrate 10 into which the trench is to be etched. A useful etch mask includes, for example, a layer 60 of SiO2 (see FIG. 3) which is deposited onto the region 50 and onto the patterned SiO2 layer 30 using, for example, conventional CVD techniques. The deposited layer 60 is then patterned by, for example, forming a resist (not shown in FIGS. 3-4) on the layer 60, patterning the resist, and then etching the SiO2 layer 60 through the patterned resist. (During the patterning of the resist, the step at the edge of the patterned SiO2 layer 30 is expeditiously used as a fiducial mark in aligning the mask used to selectively expose the resist.) A useful etchant includes, for example, a plasma struck in a $CHF_3$-containing atmosphere. The thickness of the SiO2 layer 60 ranges from about 0.1 $\mu$m to about 2 $\mu$m. Layers having thicknesses less than about 0.1 $\mu$m are undesirable because they are often incapable of withstanding the etchant used to etch the trench. On the other hand, layers having thicknesses greater than about 2 $\mu$m are undesirable because they result in undesirably large trench aspect ratios, thus increasing the difficulty of etching trenches. The substrate 10 is then etched, using the patterned SiO2 layer 60 as an etch mask, to form the trench 80.

If desired, a thin layer of dielectric material 105 is formed on the interior surface of the trench 80, and/or the trench is filled with a filler material 100 (see FIG. 5), as described above.

After the fabrication of the trench, and either before or after the trench filling step, the substrate 10 is heated to diffuse the implanted dopants into the body of the substrate, thus forming the n-tub of the single-tub CMOS device. Thereafter, conventional techniques are used to fabricate p- and n-channel FETs in, respectively, the n-tub and the p-substrate.

Figure 6:
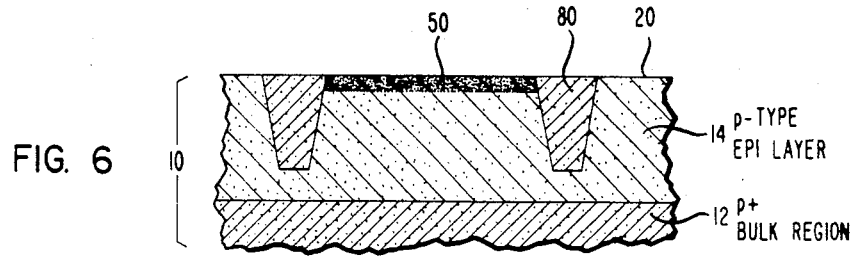
Figure 7:
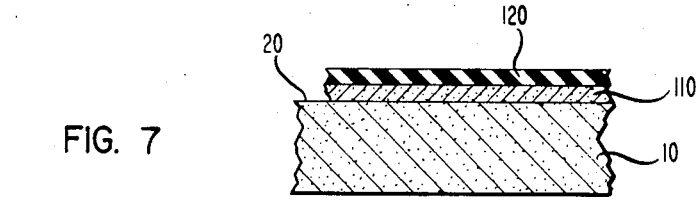
Figure 8:
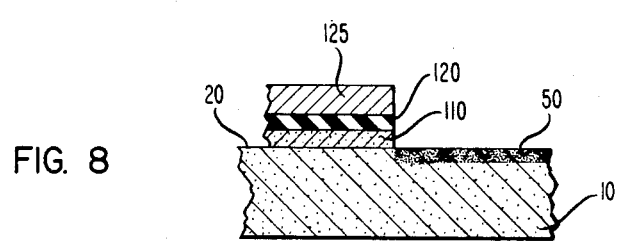
Figure 9:
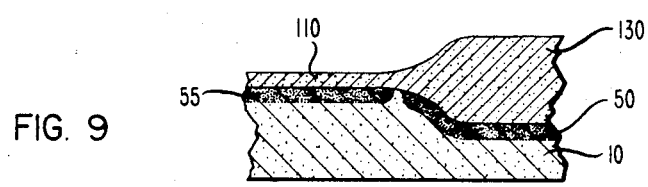

In a preferred embodiment of the inventive fabrication method, the substrate 10 includes a relatively heavily doped bulk region 12 of, for example, p-type conductivity, supporting a moderately doped, relatively thin (compared to the bulk region 12) layer 14 whose conductivity type is the same as that of the region 12 (see FIG. 6). The layer 14 is preferably epitaxially grown on the bulk region 12 using, for example, conventional vapor phase epitaxy. As before, n-type dopants are incorporated into the region 50 of the surface 20, and a trench 80 is etched almost through the thickness of the moderately doped layer 14, partially or completely encircling the implanted region 50. During the subsequent diffusion process (not shown in FIG. 6), the dopants incorporated into the region 50 will diffuse downwardly into the layer 14 to form an n-tub, while p-type dopants form the bulk region 12 will diffuse upwardly to, and even beyond, the bottom of the trench 80 (thus extending the bulk region 12 into the layer 14). As a consequence, the trench will extend into the heavily doped bulk region 12, which is advantageous because this further reduces the possibility of latchup.

The doping level within the bulk region 12 ranges from about $10^{17}$ to about $10^{21}$ cm$^{-3}$, and is preferably about $10^{20}$ cm$^{-3}$. A doping level less than about $10^{17}$ cm$^{-3}$ does not significantly reduce the possibility of latchup and thus is undesirable if latchup is to be avoided. A doping level greater than about $10^{21}$ cm$^{-3}$ is undesirable because so high a doping level results in an undesirably large out-diffusion of dopant from the bulk region 12 into the layer 14 and also increases the difficulty of epitaxially growing the layer 14 on the bulk region 12.

The layer 14 should have a thickness ranging from about 1 $\mu$m to about 20 $\mu$m, and a doping level ranging from about $10^{13}$ to about $10^{17}$ cm$^{-3}$. Thicknesses less than about 1 $\mu$m, for present device designs, are undesirable because they result in breakdown between the drains of the FETs formed in the layer 14 and the bulk region 12 that undesirably low voltages. Thicknesses greater than about 20 $\mu$m are undesirable because they offer few performance advantages over bulk substrates having similar doping levels, but are not precluded. Doping levels less than about $10^{13}$ cm$^{-3}$ are undesirable because they result in punch-through between the source of one FET and the drain of an adjacent FET formed in the layer 14. Doping levels greater than about $10^{17}$ cm$^{-3}$ are undesirable because they result in undesirably large junction capacitances associated with the FETs formed in the layer 14.

The number of dopants per unit area incorporated into the region 50 of the surface of the layer 14 should generally range from about $3 \times 10^{11}$ cm$^{-2}$ to about $1 \times 10^{14}$ cm$^{-2}$. Dopant incorporation levels outside the above range are undesirable for reasons given above.

The application of the inventive fabrication method to the formation of a twin-tub CMOS device in, for example, a p-type silicon substrate 10 (see FIG. 7) is generally similar to that described above. Here, the doping level within the substrate 10 should generally range from about $10^{14}$ to about $10^{16}$ cm$^{-3}$. Substrates with doping levels less than about $10^{14}$ cm$^{-3}$ are undesirable because they have undesirably high resistivities, resulting in undesirably high voltage drops for substrate currents emanating from devices formed in such substrates. Substrates with doping levels greater than about $10^{16}$ cm$^{-3}$ are undesirable because it is difficult to controllably compensate such substrates to form tubs.

When fabricating a twin-tub CMOS device employing one embodiment of the invention (depicted in FIGS. 7-11), n-type dopants and p-type dopants are incorporated into, respectively, first and second regions 50 and 55 of the surface 20 of the substrate 10. Dopants are incorpoated into the region 50 by initially forming a masking layer on the surface 20 which includes, for example, a layer 110 of silicon dioxide and a layer 120 of silicon nitride. The layer 110 is formed, for example, by thermally oxidizing the substrate 10, while the layer 120 is, for example, deposited by conventional CVD techniques. The thickness of the silicon dioxide layer 110 ranges from about 100 Angstroms to about 500 Angstroms and is preferably about 350 Angstroms. Layers having thicknesses less than about 100 Angstroms are undesirable because they are generaaly too thin to prevent the transmission of stresses from the subsequently deposited silicon nitride (which is typically deposited under tensile stress) to the underlying silicon, resulting in stress-induced defects in the silicon. Layers having thicknesses greater than about 500 Angstroms are undesirable because they often result in the subsequently fabricated silicon dioxide layer 130 (described below) formed on the region 50 having an undesirably large lateral extent. The thickness of the silicon nitride layer 120 ranges from about 300 Angstroms to about 2000 Angstroms and is preferably about 1000 Angstroms. A thickness less than about 300 Angstroms is undesirable because so thin a layer is often ineffective in acting as an oxidation mask, i.e., preventing the further oxidation of the region 55 during the subsequent oxidation of the region 50. A thickness greater than about 2000 Angstroms is undesirable because it often leads to stress-induced defects in the underlying silicon.

The region 50 of the surface 20 into which ntype dopants are to be incorporated is now delineated, i.e., bared, by removing the portions of the layers 120 and 110 covering the region 50. This is achieved by, for example, depositing a resist 125 (see FIG. 8) onto the upper surface of the layer 120, selectively exposing and developing the resist 125, and etching the layers 120 and 110 while using the resist as an etch mask. A useful etchant includes, for example, a plasma struck in an atmosphere of $CHF_3$ and $O_2$. After removing the resist, and with the patterned layers 120 and 110 screening the remainder of the surface 20, an n-type dopant such as phosphorus is incorporated into the region 50. (Alternatively, and if the n-type dopants are implanted, then it is often unnecessary to pattern the silicon dioxide layer 100, or to remove the patterned resist. That is, in many instances the combined thickness of the patterned resist 125 and patterned silicon nitride layer 120 is thick enough (in relation to specific dopants and dopant energies) to prevent dopant penetration, and thus thick enough to act as an implantation mask. On the other hand, the silicon dioxide layer 110 is often thin enough (in relation to specific dopants and dopant energies) to permit ready dopant penetration.) The number of incorporated dopants per unit area ranges from about $3 \times 10^{11}$ to about $10^{14}$ cm$^{-2}$. Doping levels outside this range are undesirable for reasons given above.

In order to protect the region 50 from the p-type dopants to be incorporated, e.g., implanted, into the region 55, a silicon dioxide masking layer 130 (see FIG. 9) is formed over the region 50. This is achieved, for example, by thermally oxidizing the substrate 10. The presence of the silicon nitride layer 120 and silicon dioxide layer 110 protects the region 55 against oxidation. The thickness of the silicon dioxide layer 130 ranges from about 1000 Angstroms to about 6000 Angstroms and is preferably about 4000 Angstroms. Layers having thicknesses less than about 1000 Angstroms are undesirable because they are generally insufficiently thick to prevent p-type dopants from penetrating to the region 50. Layers having thicknesses greater than about 6000 Angstroms are undesirable because such layers often extend laterally beneath the silicon nitride layer 120, screening the thus-covered region from the p-type dopant, and consequently undesirbly increasing the spacing between the n- and p-tubs.

After removing any silicon dioxide which may have formed on the layer 120 with an etchant such as an HF solution, the silicon nitride layer 120 is removed with an etchant such as hot (160 to 180 degrees C.) phosphoric acid. Then the region 55 is, for example, implanted through the relatively thin silicon dioxide layer 110 with a p-type dopant such as boron. The number of implanted dopants per unit area ranges from about $3 \times 10^{11}$ cm$^{-2}$ to about $1 \times 10^{14}$ cm$^{-2}$. Implant levels outside this range are undesirable for reasons given above.

Figure 10:
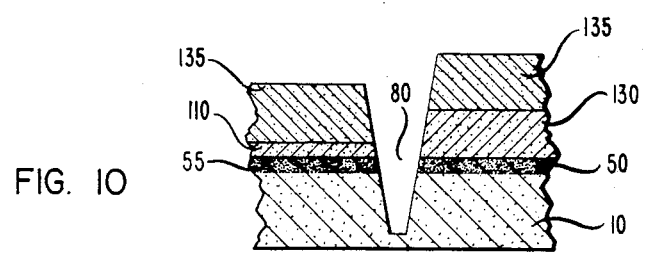
Figure 11:
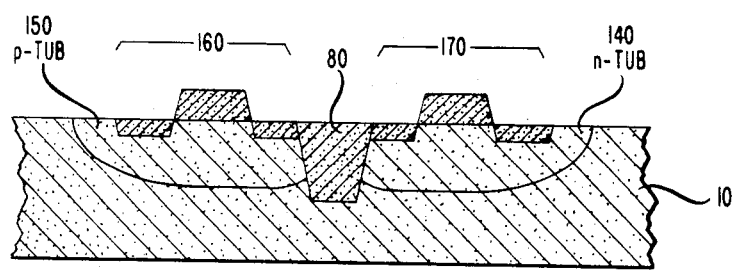

The trench 80 is now fabricated (as depicted in FIG. 10) by initially forming an etch mask (similar to the etch mask 60 used with the single-tub device) which delineates the portion of the substrate 10 into which the trench is to be etched. A useful etch mask includes, for example, a layer 135 of $SiO_2$ which is deposited onto the layers 110 and 130. The layers 135, 130 and 110 are patterned by, for example, forming a resist on the layer 135, patterning the resist, and then etching the underlying $SiO_2$ layers while using the patterned resist as an etch mask. (During the patterning of the resist, the step at the boundary between the silicon dioxide layers 110 and 130 is used as a fiducial mark in aligning the mask used to selectively expose the resist.) The thickness of the layer 135 ranges from about 0.1 μm to about 2 μm. Thicknesses outside this range are undesirable for reasons given above (in relation to the layer 60). The substrate 10 is then etched, using the patterned $SiO_2$ layers 135, 130 and 110 as an etch mask, to form the trench 80. This trench has the same width, depth, and sidewall angle (if applicable) limitations described above.

In an alternative trench fabrication procedure, the silicon dioxide layers 110 and 130 are removed, and an etch mask is formed by, for example, initially thermally oxidizing the surface 20 and then depositing silicon dioxide onto the (oxidized) surface 20. The combined thickness of the resulting $SiO_2$ layers ranges from about 0.1 μm to about 2 μm, with thicknesses outside this range being undesirable for reasons given above. The thermally grown and deposited $SiO_2$ is then patterned, and the underlying substrate etched while using the patterned $SiO_2$ as an etch mask.

The substrate 10 is heated to form the n- and p-tubs 140 and 150 (see FIG. 11) and, if desired, the trench 80 is filled with a filler material. Then, one or more n-channel FETs 160 is formed in the p-tub 150 and one or more p-channel FETs 170 is formed in the n-tub 140 (using conventional techniques) to yield the twin-tub CMOS device depicted in FIG. 11.

Figure 12:
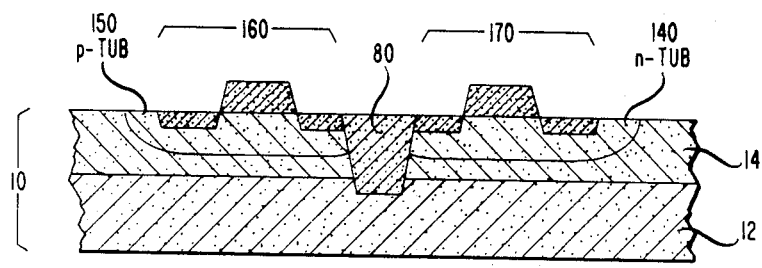
FIG. 12 is a cross-sectional view of a preferred embodiment of a twin-tub CMOS device formed in accordance with the inventive fabrication method.

Preferably, and for the reasons given above, the twin-tub device is formed in a substrate 10 which includes a relatively heavily doped bulk region 12 supporting a relatively thin, moderately doped layer 14, to yield the device depicted in FIG. 12. The doping levels and thicknesses of the bulk region 12, the layer 14 and the n- and p-tubs 140 and 150 are the same as those given above.

EXAMPLE

The following describes the fabrication of a twin-tub CMOS device using the inventive fabrication method, with the exception of the FET-fabrication steps.

The upper surface of a 4-inch silicon wafer (having p-type conductivity and a doping level of $2 \times 10^{14}$ cm$^{-3}$) was cleaned by contacting the upper surface, for about 2 minutes, with a solution containing 100 parts of $H_2O$ to 1 part HF. Then, the wafer was heated to a temperature of 950 degrees Centigrade (C.) in an oxygen atmosphere for 58 mintues to grow a layer of $SiO_2$ at the cleaned surface. The thickness of the $SiO_2$ layer was measured with an ellipsometer to be 350 Angstroms.

A layer of silicon nitride was deposited onto the upper surface of the silicon dioxide layer using conventional low pressure chemical vapor deposition (LPCVD) techniques. The thickness of the silicon nitride layer was measured with a Nanospec spectral photometer to be 1200 Angstroms.

A 1 μm-thick layer of positive photoresist, sold under the trade name HPR-204 by the Hunt Chemical Company of Palisades Park, N.J., was deposited onto the upper surface of the silicon nitride layer using conventional spin-deposition techniques. Selected areas of the resist were exposed to light of wavelength equal to about 4200 Angstroms, and the resist was developed in HPR developer, to define a pattern of windows in the resist, and thus uncover corresponding areas of the upper surface of the silicon nitride. The dimensions of the windows ranged from about 8 $\mu$m×8 $\mu$m to about 2 mm×2 mm.

While using the patterned HPR-204 resist as an etch mask, the silicon nitride layer was conventionally reactive ion etched in an atmosphere of $CHF_3$ and $O_2$ to uncover (corresponding) areas of the upper surface of the silicon dioxide layer. With the patterned resist and silicon nitride layers acting as an implant mask, phosphorus ions were implanted into the silicon wafer, through the uncovered silicon dioxide regions, to produce n-type surface regions of the silicon wafer. The ions had an energy of about 100 keV, and the dose was about $2 \times 10^{12}$ cm$^{-2}$.

After removing the resist, a new 4000 Angstrom-thick layer of silicon dioxide was grown over each of the implanted regions (using the patterned silicon nitride as an oxidation mask) by heating the wafer at 1050 degrees C. in an oxygen atmosphere for 80 minutes. This heating process also resulted in the formation of an unwanted layer of silicon dioxide on the (unetched portions of the) silicon nitride layer. The unwanted layer was removed by dipping the wafer, for 30 seconds, into a solution containing 7 parts of $H_2O$ to 1 part buffered HF. Then, the patterned silicon nitride layer was removed by dipping the wafer, for 30 minutes, into hot (160 degrees C.) phosphoric acid.

With the newly grown silicon dioxide shielding the phosphorus-implanted surface regions of the wafer, the wafer surface regions previously covered by silicon nitride and still covered by the original 350 Angstrom-thick silicon dioxide, were implanted (through the 350 Angstrom-thick silicon dioxide) with boron ions (a p-type dopant) to form implanted, p-type wafer surface regions encircling the n-type wafer surface regions. The energy of the boron ions was about 30 keV, and the dose was about $4 \times 10^{12}$ cm$^{-2}$.

A new, 1 $\mu$m-thick layer of silicon dioxide was deposited onto the upper surface of the silicon dioxide already covering the upper wafer surface, using conventional LPCVD techniques. The density of the newly deposited silicon dioxide was then increased by heating the wafer in an oxygen atmosphere at 950 degrees C. for 30 minutes.

Trenches were formed in the wafer, encircling each of the phosphorus-implanted wafer surface regions, by initially spin-depositing a 1 $\mu$m-thick layer of HPR-204 resist onto the upper surface of the newly deposited and densified silicon dioxide layer. The resist was exposed and developed to form trench-like windows in the resist (and thus uncover areas of silicon dioxide) encircling each of the phosphorus-implanted wafer surface regions. The width of the windows was about 1.25 $\mu$m.

Using the patterned resist as an etch mask, the uncovered regions of silicon dioxide, and then the underlying silicon, was reactive ion etched for 1 hour in an atmosphere into which $CFCl_3$ was flowed at 6 standard cubic centimeters per minute (sccm), $Cl_2$ was flowed at 18 sccm, and Ar was flowed at 100 sccm. The ambient pressure within the reactor chamber was 30 millitorr while the DC bias on the (wafer-bearing) power electrode was 300 volts. Each of the resulting trenches in the silicon had a width of about 1.5 $\mu$m, a depth of 3 $\mu$m, and sidewalls which formed an acute angle, $\alpha$ (see FIG. 5), with perpendiculars drawn to the original substrate surface of 9 degrees.

After removing the patterned resist, the silicon dioxide covering the upper wafer surface was thinned by about 0.2 $\mu$m, and the trench sidewalls cleaned, by dipping the wafer for 1 minute into a solution containing 7 parts of $H_2O$ to 1 part buffered HF.

With the trenches serving to prevent the formation of transition zones, n- and p-tubs, having a depth of about 2.5 $\mu$m, were formed in the wafer by heating the wafer for 2 hours, at a temperature of 1150 degrees C., in an atmosphere containing 10 percent $O_2$ and 90 percent $N_2$. This heating procedure also resulted in the formation of a layer of silicon dioxide, having a thickness of 900 Angstroms, on the interior surface of each trench.

After the formation of the tubs, the trenches were filled with polysilicon by depositing a 1.5 $\mu$m-thick layer of polysilicon onto the wafer using LPCVD techniques. This polysilicon was then etched, using a plasma struck in an atmosphere of $Cl_2$ and Ar, until the silicon dioxide layer covering the upper wafer surface was reached. Thus, the polysilicon exterior to the trench was removed, leaving intact the polysilicon within the trench.

What is claimed is:

1. A method for fabricating a device, comprising the steps of:
    incorporating diffusant comprising a dopant into a substrate which includes substrate material and a surface, said dopant being incorporated into a region of said surface;
    diffusig said dopant into a portion of said substrate; and
    completing the fabrication of said device, wherein
    said method further comprises the steps of forming a trench in said surface, partially or completely encircling said region, prior to said diffusing step, and
    at least partially filling said trench with a filler material, said filler material being chosen so that the ratio of the thermal expansion coefficient of the filler material to the thermal expansion coefficient of the substrate material is less than about three.

2. The method of claim 1 wherein said trench has a width less than or equal to about 5 $\mu$m.

3. The method of claim 1 wherein said substrate material includes semiconductor material, the conductivity type of the incorporated dopant being opposite to that of said semiconductor material.

4. The method of claim 1 wherein said completing step includes the step of forming a first field effect transistor within the diffused portion of said substrate, and a second field effect transistor within said substrate but external to said diffused portion, the channel conductivity type of said first transistor being opposite to that of said second transistor.

5. The method of claim 4 wherein one or both of said transistors is formed in abutting relationship to said trench.

6. The method of claim 4 wherein each of said transistors includes a source and a drain, and a depth of said trench is greater than or equal to the depth of the deepest source or drain of said transistors.

7. The method of claim 4 wherein said trench is filled with said filler material prior to the formation of said transistors.

8. The method of claim 7 wherein both said substrate and said filler material include silicon.

9. The method of claim 1 wherein a depth of said trench is greater than or equal to about 2 μm.

10. The method of claim 1 wherein said trench includes two sidewalls, each of said sidewalls forming an acute angle with a perpendicular drawn to said surface at the intersection of said sidewall and said trench which is less than or equal to about 20 degrees.

11. The method of claim 1 wherein said substrate includes a bulk region of semiconductor material supporting a relatively thin layer of semiconductor material whose conductivity type is the same as that of said bulk region.

* * * * *

UNITED STATES PATENT AND TRADEMARK OFFICE
CERTIFICATE OF CORRECTION

PATENT NO. : 4,656,730

DATED : April 14, 1987

INVENTOR(S) : William T. Lynch et al.

It is certified that error appears in the above-identified patent and that said Letters Patent is hereby corrected as shown below:

Column 3, line 22, "which" should read -- where --.

Column 7, line 57, "form" should read -- from --.

Column 9, line 51, "undesirbly" should read -- undesirably --.

Signed and Sealed this

Eighth Day of December, 1987

Attest:

DONALD J. QUIGG

Attesting Officer

Commissioner of Patents and Trademarks